(12) United States Patent
Ogura

(10) Patent No.: US 10,725,487 B2
(45) Date of Patent: Jul. 28, 2020

(54) POWER CIRCUIT INCLUDING BALLAST ELEMENT

(71) Applicant: KABUSHIKI KAISHA TOSHIBA, Tokyo (JP)

(72) Inventor: Akio Ogura, Shinagawa Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/446,987

(22) Filed: Mar. 1, 2017

(65) Prior Publication Data
US 2018/0067509 A1 Mar. 8, 2018

(30) Foreign Application Priority Data
Sep. 8, 2016 (JP) .................. 2016-175804

(51) Int. Cl.
*G05F 1/575* (2006.01)
*H01L 23/64* (2006.01)
*H03F 3/21* (2006.01)
*H03F 3/45* (2006.01)

(52) U.S. Cl.
CPC ............ *G05F 1/575* (2013.01); *H01L 23/642* (2013.01); *H03F 3/21* (2013.01); *H03F 3/45475* (2013.01); *H03F 2203/45116* (2013.01)

(58) Field of Classification Search
CPC ..... G05F 1/10; G05F 1/27; G05F 1/59; G05F 1/565; G05F 1/56; G05F 1/46; G05F 1/461; G05F 1/467; G05F 1/468; G05F 1/575; H03F 2200/03; H03F 3/183; H03F 3/185; H03F 3/21; H03F 3/45475; H03F 2203/45116; H01L 23/642; H05K 999/99
See application file for complete search history.

(56) References Cited

U.S. PATENT DOCUMENTS 5,691,663 A * 11/1997 Nayebi ............... G11B 5/00
  327/379
5,889,393 A    3/1999  Wrathall
6,304,131 B1  10/2001  Huggins et al.
7,248,025 B2   7/2007  Adachi
(Continued)

FOREIGN PATENT DOCUMENTS

JP    H05-35344     2/1993
JP    2000-284843  10/2000
(Continued)

OTHER PUBLICATIONS

Japanese Office Action dated Jun. 25, 2019, mailed in counterpart Japanese Application 2016-175804, 7 pages (with translation).

*Primary Examiner* — Gustavo A Rosario-Benitez
(74) *Attorney, Agent, or Firm* — Kim & Stewart LLP

(57) ABSTRACT

A power circuit of an embodiment includes an amplifier circuit having a first and a second input. The amplifier circuit receives power from a power input and outputs an output voltage corresponding to a voltage difference between the first and second inputs. A reference voltage circuit supplies a reference voltage to the first input. A feedback circuit supplies a feedback voltage corresponding to the output voltage to the second input. A first ballast capacitance element is between the power input and the first input of the amplifier circuit.

18 Claims, 9 Drawing Sheets

(56) References Cited

U.S. PATENT DOCUMENTS

| | | | | |
|---|---|---|---|---|
| 2003/0102851 A1* | 6/2003 | Stanescu | ............... | G05F 1/575 323/280 |
| 2010/0013448 A1* | 1/2010 | Motz | ............... | G05F 1/575 323/280 |
| 2011/0193540 A1* | 8/2011 | Dasgupta | ............... | H02M 1/15 323/282 |
| 2012/0025912 A1* | 2/2012 | Oomori | ............... | H03F 3/45183 330/257 |
| 2013/0069608 A1* | 3/2013 | Gakhar | ............... | G05F 1/575 323/273 |
| 2013/0320944 A1* | 12/2013 | Siao | ............... | G05F 1/56 323/282 |
| 2014/0085003 A1* | 3/2014 | Quinn | ............... | H03F 1/56 330/253 |

FOREIGN PATENT DOCUMENTS

| | | |
|---|---|---|
| JP | 2001-195138 | 7/2001 |
| JP | 2002-032133 | 1/2002 |
| JP | 2002-182758 | 6/2002 |
| JP | 2005-316799 | 11/2005 |
| JP | 2013-197858 | 9/2013 |
| JP | 2014-006794 | 1/2014 |

\* cited by examiner

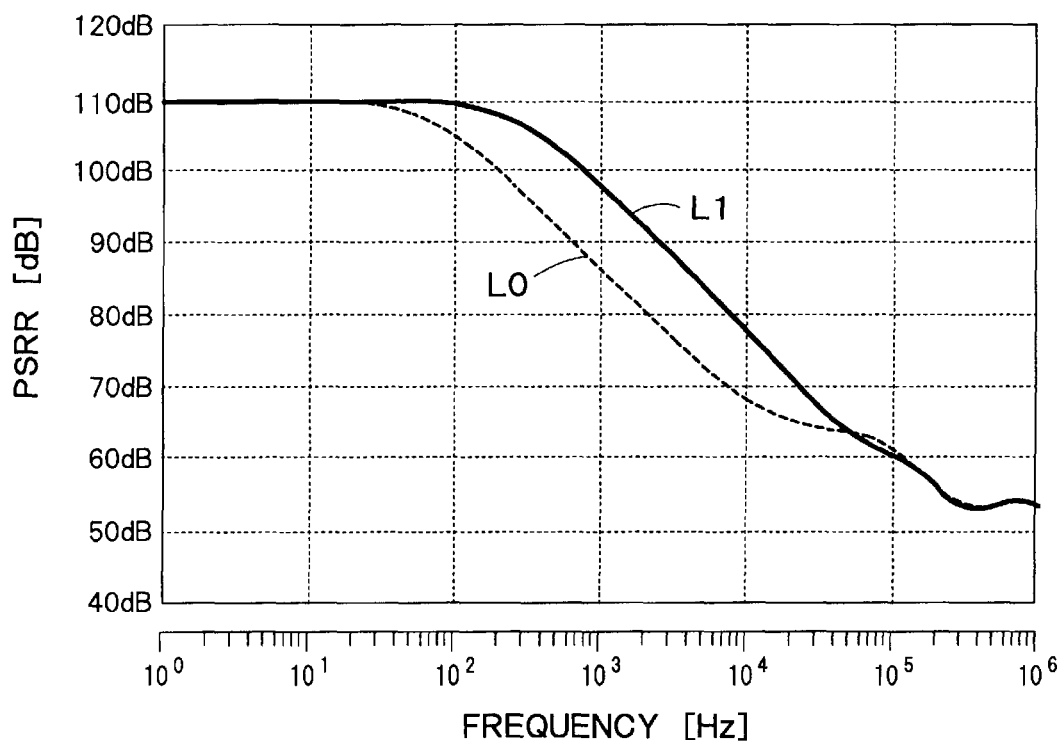

POWER CIRCUIT INCLUDING BALLAST ELEMENT

CROSS-REFERENCE TO RELATED APPLICATION

This application is based upon and claims the benefit of priority from Japanese Patent Application No. 2016-175804, filed Sep. 8, 2016, the entire contents of which are incorporated herein by reference.

FIELD

Embodiments described herein relate generally to a power circuit.

BACKGROUND

In the related art, power circuits including switching regulators or linear regulators are used to supply appropriate power-supply voltages to a number of devices included in electronic apparatuses. When linear regulators receive variations in power-supply input to amplifiers (hereinafter referred to as noise), the linear regulators have capabilities to reduce the noise. Power supply ripple rejection ratio (PSRR) characteristics are known as an index indicating a capability to remove noise in a linear regulator. The PSRR characteristics are expressed as a ratio of a variation in input voltage to a variation in an output voltage from the regulator. The variation of the output voltage to a variation (noise) of the power-supply voltage or the reference voltage becomes smaller, and the resistance to noise is improved, as the PSRR becomes higher. To improve the PSRR characteristics, methods of stabilizing a reference voltage source of a linear regulator, adjusting frequency characteristics of an open-loop, or increasing a gain have been considered. In these methods, however, a problem occurs in that a circuit area of the linear regulator increases or the current consumption increases.

DESCRIPTION OF THE DRAWINGS

FIG. 5 is a graph illustrating PSRR characteristics of a linear regulator according to the first embodiment.

DETAILED DESCRIPTION

Figure 1:
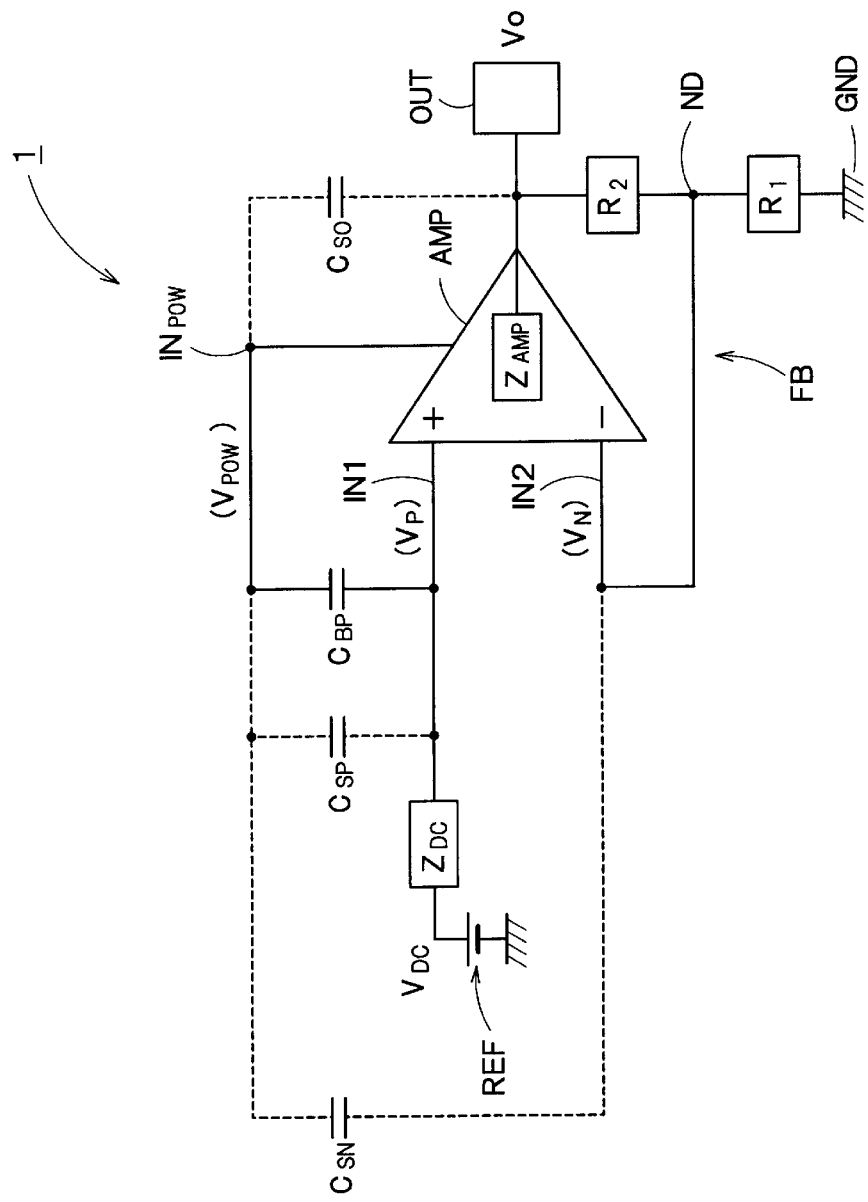
FIG. 1 is a circuit diagram illustrating an example of a configuration of a linear regulator according to a first embodiment.

In general, according to one embodiment, a power circuit includes an amplifier circuit having a first input and a second input. The amplifier circuit receives power from a power input and outputs an output voltage that corresponds to a voltage difference between the first and second inputs. A reference voltage circuit supplies a reference voltage to the first input of the amplifier circuit. A feedback circuit supplies a feedback voltage that corresponds to the output voltage to the second input of the amplifier circuit. A first ballast capacitance element is between the power input and the first input of the amplifier circuit.

In some examples, the first ballast capacitance element is provided having a capacitance value between the power input and the first input such that a reciprocal (1/PSRR) of a power supply rejection ratio (PSRR) of the amplifier circuit is closer to 0 than when the first ballast capacitance element is not provided.

Hereinafter, exemplary embodiments will be described with reference to the drawings. The present disclosure is not limited to the exemplary embodiments.

First Embodiment

In general, it is necessary to supply power (direct-current power) at an appropriate voltage for each device (for example, a microcomputer, a sensor, and a driver) that is included in an electronic apparatus, such as a mobile terminal. A power circuit, such as a switching regulator and/or a linear regulator, is used to convert the power-supply voltage into a desired voltage.

Power conversion efficiency of a switching regulator is generally good. Therefore, when a power-supply voltage is lowered, the power loss will be small. However, a switching regulator tends to cause ripples (a voltage variation, hereinafter referred to as noise) in the power-supply voltage due to switching of a semiconductor switching element.

A linear regulator is typically inferior to a switching regulator in power conversion efficiency since any voltage difference between an input voltage and an output voltage is dissipated as heat. However, a linear regulator can often supply power with smaller noise since ripples that might be caused by switching do not occur.

Accordingly, a power circuit including a switching regulator and a linear regular is connected such that the switching regulator is usually connected closer to the power supply than the linear regulator. In this case, a power-supply voltage can be efficiently first lowered by the switching regulator and then subsequently converted into a power-supply voltage with small noise as is appropriate for each device (load) by the linear regulator. Thus, the power circuit can supply the power having small noise to the load with high power conversion efficiency.

When a voltage input to the power circuit and a voltage output from the power circuit is small or a current output from the power circuit is small, power may be converted only by the linear regulator without intervention of the switching regulator. In this case, this is because power conversion efficiency is not so important since supply power is low.

Such a linear regulator has a capability to reduce noise included in power from the switching regulator or power from a power supply. Here, either power (or a voltage) from the switching regulator or power (or a voltage) from the power supply may be referred to as power-supply power (or power-supply voltage) from the linear regulator, and thus are also collectively referred to as power-supply power (or power-supply voltage). The capability to remove noise is expressed with a power supply ripple rejection ratio (PSRR). The PSRR is expressed with a ratio of a variation value of a power-supply voltage to a variation value of an output voltage. A variation in an output voltage to a variation (noise) of a power-supply voltage is smaller as the PSRR becomes higher. That is, it can be said that a linear regulator with a high PSRR has high resistance to power-supply noise.

FIG. 1 is a circuit diagram illustrating an example of the configuration of a linear regulator according to a first embodiment. A linear regulator 1 includes an amplifier circuit AMP, a reference voltage circuit REF, a feedback circuit FB, and a first capacitance element $C_{BP}$.

The amplifier circuit AMP includes a first input IN1, a second input IN2, a power input $IN_{POW}$, and an output unit OUT. The amplifier circuit AMP receives power-supply power from the power input $IN_{POW}$ and outputs an output voltage (first voltage) $V_O$ according to a voltage difference between the first input IN1 and the second input IN2 to the output OUT. The first input IN1 inputs a reference voltage $V_P$ from the reference voltage circuit REF and the second input IN2 inputs a feedback voltage $V_N$ from the feedback circuit FB. Thus, the amplifier circuit AMP has a function of adjusting the output voltage $V_O$ so that the feedback voltage $V_N$ is the same as the reference voltage $V_P$ and of maintaining the adjusted output voltage $V_O$. The amplifier circuit AMP may be, for example, a differential amplifier circuit in which transistors provided on a semiconductor substrate are used. Here, $Z_{AMP}$ is an output impedance of the amplifier circuit AMP.

The reference voltage circuit REF generates a voltage $V_{DC}$ that does not depend on a power-supply voltage or temperature. The reference voltage circuit REF is connected to the first input IN1 of the amplifier circuit AMP and inputs the reference voltage $V_P$ to the first input IN1. The reference voltage circuit REF has output impedance $Z_{DC}$, and inputs the generated voltage $V_{DC}$ as reference voltage $V_P$ to the first input IN1. The reference voltage circuit REF may be, for example, a band gap type power circuit.

The feedback circuit FB is connected between the output OUT and the second input IN2 and feeds a feedback voltage corresponding to the output voltage back to the second input IN2. The feedback circuit FB includes a first resistance element R1 and a second resistance element R2. The first resistance element R1 and the second resistance element R2 are connected in series between the output OUT and a low voltage supply GND. The first resistance element R1 is connected between the low voltage supply GND and a node ND, and the second resistance element R2 is connected between the node ND and the output OUT. The node ND is electrically connected to the second input IN2 and feeds the feedback voltage $V_N$, as obtained by dividing the output voltage $V_O$ by the first resistance element R1 and the second resistance element R2, back to the second input IN2. The first resistance element R1 and the second resistance element R2 may be, for example, wiring resistors or diffusion layer resistors. The low voltage supply GND may be lower than an input voltage $V_{POW}$ to be input to the power input $IN_{POW}$ or may be, for example, a ground voltage supply (ground).

The first capacitance element $C_{BP}$ is connected between the power input $IN_{POW}$ and the first input IN1. The first capacitance element $C_{BP}$ is provided as ballast capacitance to prevent noise from being generated in the output voltage $V_O$ of the amplifier circuit AMP by parasitic capacitances $C_{SN}$, $C_{SP}$, and $C_{SO}$ and to improve the power supply ripple rejection ratio (PSRR) of the amplifier circuit AMP. The first capacitance element $C_{BP}$ may be, for example, a metal insulator semiconductor (MIS) capacitor or may be wiring capacitance.

Figure 2:
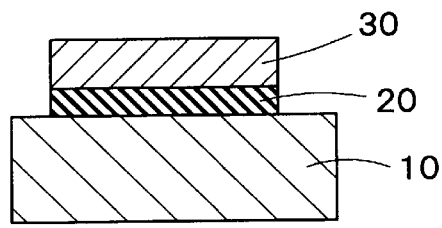
FIG. 2 is a cross-sectional view illustrating an example of a configuration of a MIS capacitor.

FIG. 2 is a cross-sectional view illustrating an example of the configuration of a MIS capacitor. When a MIS capacitor is used as the first capacitance element $C_{BP}$, the first capacitance element $C_{BP}$ includes a substrate 10, a gate insulation film (first insulation film) 20, and a gate electrode 30. The substrate 10 is, for example, a semiconductor substrate, such as a doped silicon substrate, and serves as a conductor. The gate insulation film 20 is provided on the substrate 10 and may be formed of, for example, an insulating material such as a silicon oxide film. The gate electrode 30 is provided on the gate insulation film 20 and may be formed of, for example, a conductive material such as polysilicon or metal. The substrate 10, serving as the first electrode, is electrically connected to the first input IN1. The gate electrode 30 serving as the second electrode is electrically connected to the power input $IN_{POW}$. Thus, the first capacitance element $C_{BP}$ functions as capacitance between the power input $IN_{POW}$ and the first input IN1. The capacitance of the first capacitance element $C_{BP}$ may be adjusted by adjusting the thickness of the gate insulation film 20 and/or a facing area of the gate electrode 30 and the substrate 10. The gate insulation film 20 may be formed of the same material as a MISFET gate insulation film provided on the substrate 10. The gate electrode 30 may be formed of the same material as a MISFET gate electrode provided on the substrate 10.

Figure 3A:
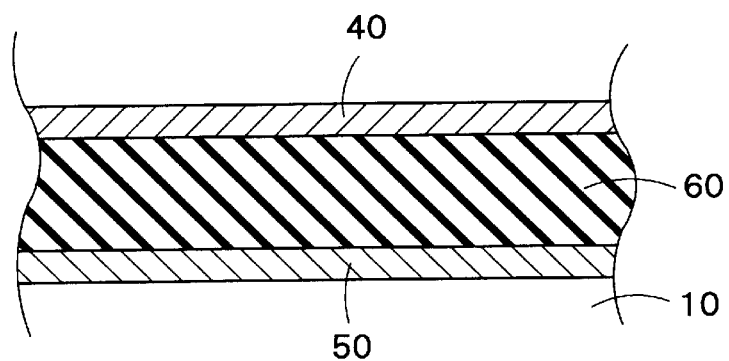
FIGS. 3A and 3B are diagrams illustrating examples of a configuration of wiring capacitance.
Figure 3B:
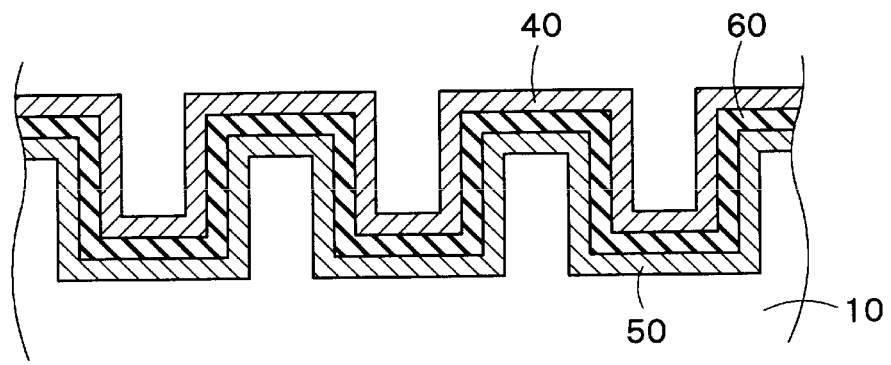

FIGS. 3A and 3B are diagrams illustrating examples of the configuration of a wiring capacitance. When wiring capacitance is used as the first capacitance element $C_{BP}$, the first capacitance element $C_{BP}$ includes a power wiring 40, a first wiring 50, and an insulation film (second insulation film) 60. The power wiring 40 extends from the power input $IN_{POW}$ to the amplifier circuit AMP. For example, the power wiring 40 may be a wiring between a power terminal of the linear regulator 1 receiving input power (power-supply power) from a power supply or a switching regulator (not illustrated) and a power terminal of the amplifier circuit AMP. The first wiring 50 is a wiring between the reference voltage circuit REF and the first input IN1. The power wiring 40 and the first wiring 50 are both formed of, for example, a conductive material such as polysilicon or metal. The insulation film 60 is provided between the power wiring 40 and the first wiring 50 and electrically insulates the power wiring 40 from the first wiring 50. The insulation film 60 may be, for example, an insulating material such as a silicon oxide. The power wiring 40 and the first wiring 50 extend in substantially parallel with each other for at least some portion of their length. Thus, the power wiring 40, the first wiring 50, and the insulation film 60 form a capacitance between the power input $IN_{POW}$ and the first input IN1. The capacitance of the first capacitance element $C_{BP}$ may be adjusted by changing a distance between the power wiring 40 and the first wiring 50 (i.e., the thickness of the insulation film 60) or the lengths of the portions of the power wiring 40 and the first wiring 50 that are substantially parallel to each other.

The power wiring 40 and the first wiring 50 may extend in substantially parallel in a straight line manner, as illustrated in FIG. 3A, or may extend in substantially parallel in a staggered disposition (serpentine), as illustrated in FIG. 3B.

The power wiring 40, the first wiring 50, and the insulation film 60 illustrated in FIGS. 3A and 3B may be arranged in substantially parallel (horizontal direction) to the surface of the substrate 10 on which the amplifier circuit AMP is provided or they may be stacked in the substantially perpendicular direction (vertical direction) to the surface of the substrate 10. That is, the power wiring 40 and the first wiring 50 may be wiring provided in the same layer or may be stacked wirings in different layers. The capacitance of the first capacitance element $C_{BP}$ will be described below.

In the foregoing configuration, the linear regulator 1 according to the first embodiment functions to output the substantially constant output voltage $V_O$ from the output unit OUT to a load (not illustrated).

Here, the parasitic capacitances $C_{SN}$, $C_{SP}$, and $C_{SO}$ will be described.

The parasitic capacitance $C_{SN}$ occurs between the power input $IN_{POW}$ and the second input IN2 and includes, for example, inter-electrode capacitance or inter-wiring capacitance of transistors included in the amplifier circuit AMP. Noise from the input voltage $V_{POW}$ is generated in (is mixed with) the output voltage $V_O$ via the parasitic capacitance $C_{SN}$ and the second resistance element R2 in some cases.

The parasitic capacitance $C_{SP}$ occurs between the power input $IN_{POW}$ and the first input IN1 and includes, for example, inter-electrode capacitance or inter-wiring capacitance of transistors included in the amplifier circuit AMP. Noise of the input voltage $V_{POW}$ is divided between the output impedance $Z_{DC}$ of the reference voltage circuit REF and the parasitic capacitance $C_{SP}$ and is generated in (is mixed with) the reference voltage $V_P$ is some cases. In this case, the noise of the input voltage $V_{POW}$ is also generated in the output voltage $V_O$.

The parasitic capacitance $C_{SO}$ occurs between the power input $IN_{POW}$ and the output OUT and includes, for example, inter-electrode capacitance or inter-wiring capacitance of transistors included in the amplifier circuit AMP. Noise of the input voltage $V_{POW}$ is divided between the output impedance $Z_{AMP}$ of the amplifier circuit AMP and the parasitic capacitance $C_{SO}$ and is generated in (is mixed with) the output voltage $V_O$ in some cases.

In this way, the noise of the input voltage $V_{POW}$ is generated in the output voltage $V_O$ via the parasitic capacitances $C_{SN}$, $C_{SP}$, and $C_{SO}$. The mixing of the noise is a cause of deterioration in noise removal characteristics (that is, the PSRR) of the linear regulator.

Power noise generated in the output voltage $V_O$ is obtained by superposition of the noise originating from the parasitic capacitances $C_{SN}$, $C_{SP}$, and $C_{SO}$. A phase of the noise transmitted via the parasitic capacitances $C_{SN}$, $C_{SP}$, and $C_{SO}$ is advanced by 90 degrees from a phase of the noise of the input voltage $V_{POW}$.

Figure 4A:
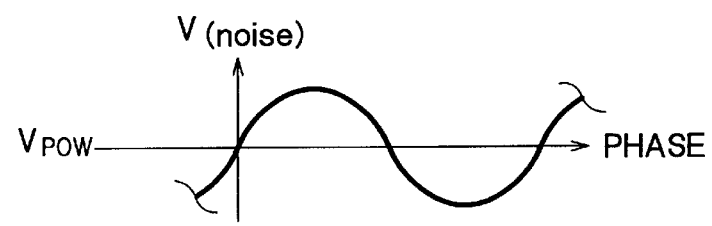
FIGS. 4A to 4E are graphs illustrating waveforms of noise.
Figure 4B:
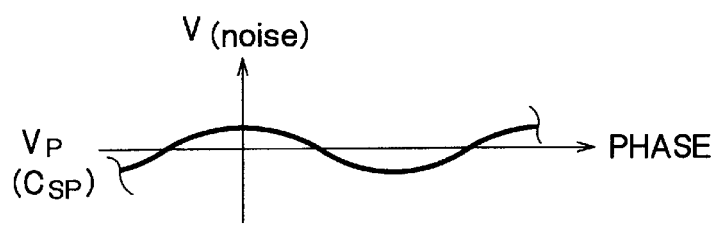
Figure 4C:
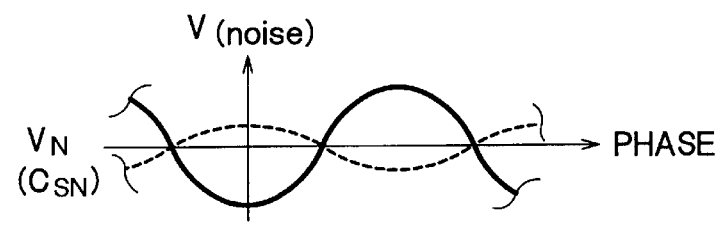
Figure 4D:
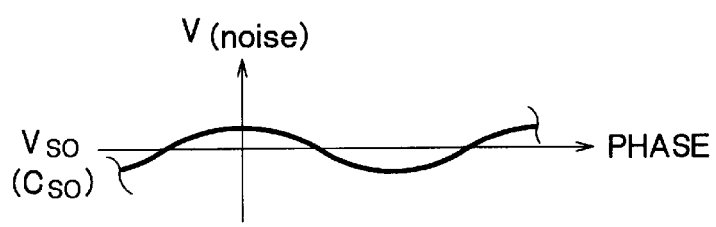
Figure 4E:
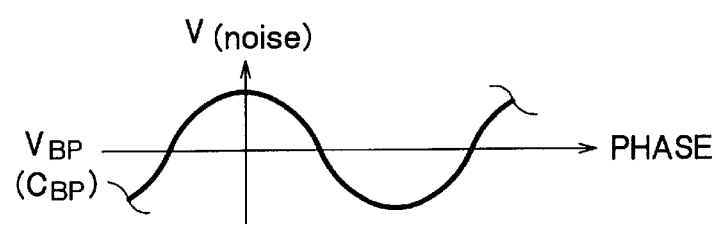

FIGS. 4A to 4E are graphs illustrating waveforms of noise. The vertical axis represents the magnitude of a noise component (voltage) and the horizontal axis represents a phase (time). FIG. 4A illustrates noise of the input voltage $V_{POW}$. FIG. 4B illustrates noise transmitted via the parasitic capacitance $C_{SP}$ in the output OUT. FIG. 4C illustrates noise transmitted via the parasitic capacitance $C_{SN}$ in the second input IN2 and the output OUT. In FIG. 4C, a dotted line indicates the noise in the second input IN2 and a solid line indicates the noise in the output OUT. FIG. 4D illustrates noise transmitted via the parasitic capacitance $C_{SO}$ in the output OUT. FIG. 4E illustrates noise (ballast noise) transmitted via the first capacitance element $C_{BP}$ in the output OUT. The waveforms of the noise in FIGS. 4A to 4E are depicted to facilitate the understanding conveniently and may be different from waveforms of actual noise in real device.

A phase of the noise of the input voltage $V_{POW}$ is advanced by 90 degrees when the noise is transmitted via the capacitance ($C_{SP}$, $C_{SN}$, $C_{SO}$, or $C_{BP}$). However, when noise is input to an inverted input terminal as in the second input IN2 in FIG. 1, as illustrated in FIG. 4C, the phase of the noise is inverted at 180 degrees in the output OUT. That is, the phase of the noise of the input voltage $V_{POW}$ is advanced by 90 degrees by the parasitic capacitance $C_{SN}$, and then further is inverted at 180 degrees from the inverted input (the second input IN2) of the amplifier circuit AMP and is transmitted to the output OUT.

On the other hand, as illustrated in FIG. 4B, the phase of the noise in the first input IN1 is not inverted in the output unit OUT. That is, the phase of the noise of the input voltage $V_{POW}$ is transmitted to the output OUT in a state in which the phase of the noise is advanced by 90 degrees by the parasitic capacitance $C_{SP}$. As illustrated in FIG. 4D, the phase of the noise transmitted to the output voltage $V_O$ via the parasitic capacitance $C_{SO}$ is also transmitted to the output OUT in a state in which the phase of the noise is advanced by 90 degrees by the parasitic capacitance $C_{SO}$.

In this way, the phase of the noise by the parasitic capacitance $C_{SN}$ is inverted with respect to the phase of the noise by the parasitic capacitances $C_{SP}$ and $C_{SO}$. Since the noise mixed in the output voltage $V_O$ by the parasitic capacitances $C_{SP}$, $C_{SN}$, and $C_{SO}$ is a sum of a curve of FIG. 4B, a curve of FIG. 4D, and a solid curved line of FIG. 4C, the noise by the parasitic capacitance $C_{SN}$ and the noise by the parasitic capacitances $C_{SP}$ and $C_{SO}$ operate to be cancel each other.

Normally, the parasitic capacitances $C_{SP}$, $C_{SN}$, and $C_{SO}$ are not intentionally provided, but are accidentally occurring or unavoidable capacitance. Accordingly, it would be merely an accident and considerably rare that the absolute value of the noise by the parasitic capacitance $C_{SN}$ would be the same as the absolute value of the noise by the parasitic capacitances $C_{SP}$ and $C_{SO}$ and such that noise of the output voltage $V_O$ would not be generated.

However, in this embodiment, the first capacitance element $C_{SP}$ is intentionally provided as ballast capacitance to prevent noise being mixed in the output voltage $V_O$ due to the parasitic capacitances $C_{SP}$, $C_{SN}$, and $C_{SO}$. For example, when the absolute value of the noise by the parasitic capacitance $C_{SN}$ is greater than the absolute value of the noise by the parasitic capacitances $C_{SP}$ and $C_{SO}$, as illustrated in FIG. 1, the first capacitance element $C_{BP}$ can be connected between the power input $IN_{POW}$ and the first input IN1 and provided in parallel to the parasitic capacitance $C_{SP}$. Thus, a ballast noise component illustrated in FIG. 4E is also added to the output voltage $V_O$, and thus the total sum of the noise in the output voltage $V_O$ is reduced in magnitude.

For example, when $NV_{OP}$ is a noise component mixed in the output voltage $V_O$ by the parasitic capacitance $C_{SP}$ and the first capacitance element $C_{SP}$, $NV_{OP}$ is expressed by Expression 1:

$$NV_{OP}=(1+R_2/R_1)\times NV_P \quad \text{Expression 1:}$$

where $NV_P$ is assumed to be a noise component mixed in the first input IN1 by the parasitic capacitance $C_{SP}$ and the first capacitance element $C_{BP}$. In the amplifier circuit AMP, the feedback voltage $V_N$ is assumed to be the same as the reference voltage $V_P$.

$NV_P$ is expressed by Expression 2:

$$NV_P=\{Z_{DC}/(Z_{DC}+1/(j\omega(C_{SP}+C_{BP})))\}\times V_{POW} \quad \text{Expression 2:}$$

Here, j is a complex number, $\omega$ is $2\pi f$, and f is a frequency of noise.

Expression 3 is established based on Expressions 1 and 2:

$$NV_{OP}=(1+R_2/R_1)\times[\{Z_{DC}/(Z_{DC}+1/(j\omega(C_{SP}+C_{BP})))\}\times V_{POW}] \quad \text{Expression 3:}$$

Here, a phase of $NV_{OP}$ is advanced by 90 degrees from $V_{POW}$ by the parasitic capacitance $C_{SP}$ and the first capacitance element $C_{BP}$.

When $NV_{ON}$ is a noise component mixed in the output voltage $V_O$ from the second input IN2 by the parasitic capacitance $C_{SN}$, $NV_{ON}$ is expressed by Expression 4:

$$NV_{ON} = -R_2/(1/(j\omega C_{SN})) \times V_{POW} \quad \text{Expression 4:}$$

Here, a phase of $NV_{ON}$ is delayed by 90 degrees as compared to $V_{POW}$ (an inverted state with respect to the phase of $NV_{OP}$), as described. That is, when $V_{POW}$ is a positive voltage, $NV_{ON}$ is a negative voltage component.

When $NV_{OO}$ is a noise component mixed in the output voltage $V_O$ from the amplifier circuit AMP by the parasitic capacitance $C_{SO}$, $NV_{OO}$ is expressed by Expression 5:

$$NV_{OO} = \{Z_{AMP}/(Z_{AMP} + 1/(j\omega C_{SO}))\} \times V_{POW} \quad \text{Expression 5:}$$

Here, a phase of $NV_{OO}$ is advanced by 90 degrees from $V_{POW}$. That is, when $V_{POW}$ is a positive voltage, $NV_{OO}$ is a positive voltage component.

A noise component $NV_O$ ($NV_{OP} + NV_{ON} + NV_{OO}$) generated in the output voltage $V_O$ by the parasitic capacitances $C_{SP}$, $C_{SN}$, and $C_{SO}$ and the first capacitance element $C_{BP}$ is expressed by Expression 6:

$$NV_O = \{(1 + R_2/R_1)Z_{DC}/(Z_{DC} + 1/(j\omega(C_{SP} + C_{BP}))) - R_2/(1/(j\omega C_{SN})) + Z_{AMP}/(Z_{AMP} + (1/j\omega C_{SO}))\} \times V_{POW} \quad \text{Expression 6:}$$

In order to bring the noise component $NV_O$ close to zero, the absolute value of the right side of Expression 6 should approach zero. A reciprocal (1/PSRR) of PSRR is expressed by Expression 7:

$$1/PSRR = \partial NV_O / \partial V_{POW} = \{(1 + R_2/R_1)Z_{DC}/(Z_{DC} + 1/(j\omega(C_{SP} + C_{BE}))) - R_2/(1/(j\omega C_{SN})) + Z_{AMP}/(Z_{AMP} + (1/j\omega C_{SO}))\} \quad \text{Expression 7:}$$

By bringing the absolute value of the right side of Expression close to zero, it is possible to obtain high PSRR characteristics.

Here, when the first capacitance element $C_{BP}$ is not provided, a method of bringing, for example, one or a plurality of $C_{SP}$, $C_{SN}$, $C_{SO}$, $Z_{DC}$, and $Z_{AMP}$ close to zero can be used to bring the absolute value of the right side of Expression 7 close to zero. However, in this method, there is a concern with increasing a circuit area or a current consumption, as described above.

Accordingly, in the embodiment, the first capacitance element $C_{BP}$ is provided as ballast capacitance so that a positive component (a noise component with the same polarity as the input voltage $V_{POW}$) of Expression 7 is the same as a negative component (a noise component with a reverse polarity to the input voltage $V_{POW}$).

In the right side of Expression 7, the first and third terms related to the parasitic capacitances $C_{SP}$ and $C_{SO}$ and the first capacitance element $C_{BP}$, are positive components, and the second term related to the parasitic capacitance $C_{SN}$ is a negative component. Here, in the first embodiment, when the first capacitance element $C_{BP}$ is not provided, the reciprocal (1/PSRR) of the PSRR is assumed to be smaller than 0. In this case, the positive components related to the parasitic capacitances $C_{SP}$ and $C_{SO}$ are less than the negative component related to the parasitic capacitance $C_{SN}$. Accordingly, by providing the first capacitance element $C_{BP}$ in parallel to the parasitic capacitance $C_{SP}$, it is possible to actually increase the positive component. Thus, the linear regulator 1 according to the embodiment causes the absolute value of the reciprocal (1/PSRR) of the PSRR to be closer to 0 than when the first capacitance element $C_{BP}$ is not provided.

In this way, in the linear regulator 1 according to the embodiment, the first capacitance element $C_{BP}$ is connected between the power input $IN_{POW}$ and the first input IN1, and thus the noise mixed in the output voltage $V_O$ can approach zero (almost cancelled) by the parasitic capacitances $C_{SN}$, $C_{SP}$, and $C_{SO}$. Thus, the PSRR characteristics of the linear regulator 1 are improved.

FIG. 5 is a graph illustrating PSRR characteristics of the linear regulator 1 according to the first embodiment. The vertical axis of the graph represents PSRR (dB). The horizontal axis represents a frequency (Hz) of power noise mixed in the output voltage $V_O$.

A line L0 indicates the PSRR characteristic of a linear regulator in which the first capacitance element $C_{BP}$ is not provided. A line L1 indicates PSRR characteristics of a linear regulator in which the first capacitance element $C_{BP}$ according to the first embodiment is provided.

For example, referring to power noise with $10^3$ Hz frequency, the PSRR of the line L1 is higher by about 12 dB than the PSRR of the line L0. Accordingly, it can be understood that the PSRR characteristics can be considerably improved by providing the first capacitance element $C_{BP}$ as in the first embodiment.

The capacitance of the first capacitance element $C_{BP}$ at which the absolute value of 1/PSRR approaches 0 can be determined by an actual measured value of the PSRR characteristics, a statistical averaged value, or a simulation. Since the capacitance of the first capacitance element $C_{BP}$ is set to balance positive and negative components of the power noise, a very small capacitance may be set. For example, the capacitance of the first capacitance element $C_{BP}$ set by a simulation depicted in FIG. 5 is about 20 fF (femtofarads), a layout area of the linear regulator 1 is not greatly increased, and an area penalty is small relative to the improved performance. Accordingly, the linear regulator 1 according to the first embodiment has good PSRR characteristics and can be manufactured at low cost without significantly increasing a chip size. In the linear regulator 1 according to the first embodiment, an increase in current consumption is avoided since the output impedances $Z_{AMP}$ and $Z_{DC}$ are not changed.

Second Embodiment

Figure 6:
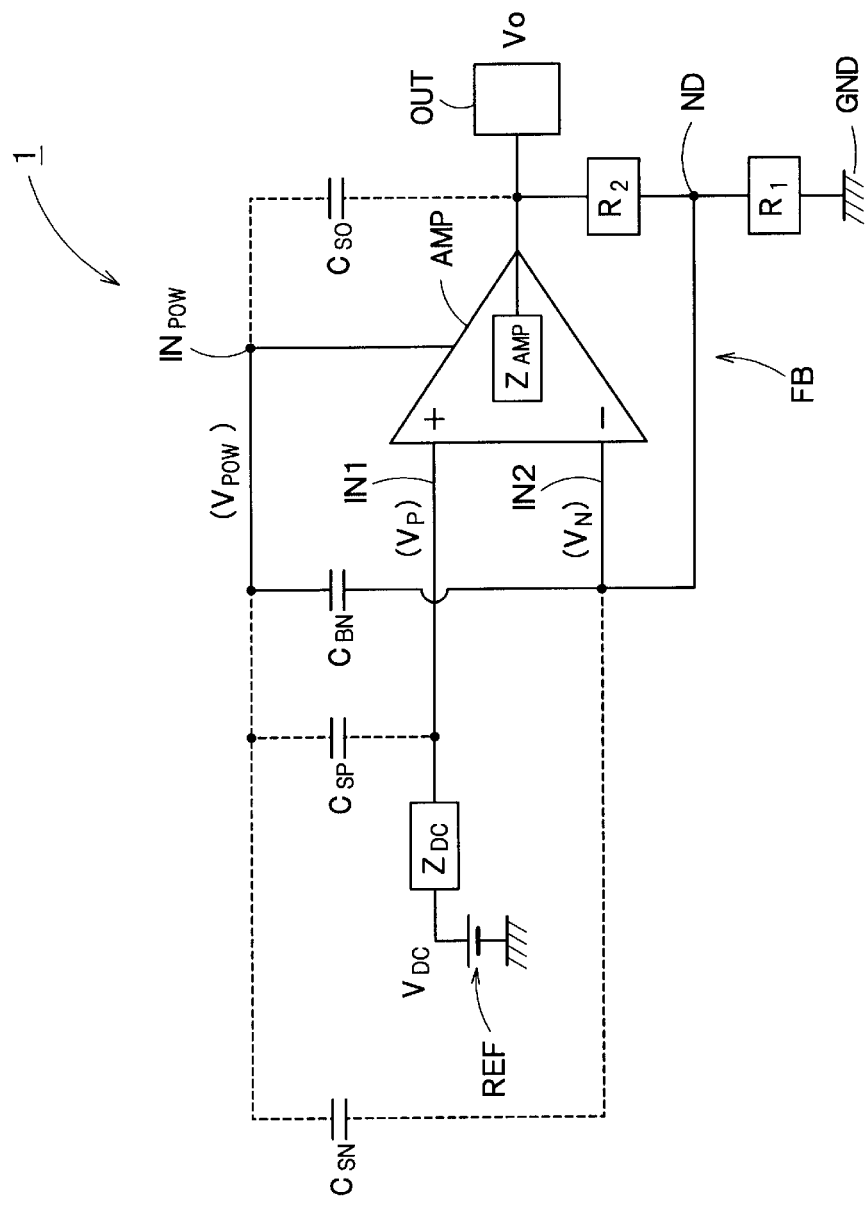
FIG. 6 is a circuit diagram illustrating an example of a configuration of a linear regulator according to a second embodiment.

FIG. 6 is a circuit diagram illustrating an example of the configuration of a linear regulator according to a second embodiment. A linear regulator 1 according to the second embodiment includes a second capacitance element $C_{BN}$. The second capacitance element $C_{BN}$ is connected between a power input $IN_{POW}$ and a second input IN2. The second capacitance element $C_{BN}$ is provided as ballast capacitance to prevent noise being generated in an output voltage $V_O$ of an amplifier circuit AMP by parasitic capacitances $C_{SN}$, $C_{SP}$, and $C_{SO}$ and to improve a power supply ripple rejection ratio (PSRR) of the amplifier circuit AMP. As with the first capacitance element $C_{BP}$, the second capacitance element $C_{BN}$ may be, for example, a MIS capacitor or may be wiring capacitance as illustrated in FIG. 2 or 3A and 3B. The other remaining configuration details of the second embodiment may be considered the same as the corresponding configuration of the first embodiment.

Figure 7A:
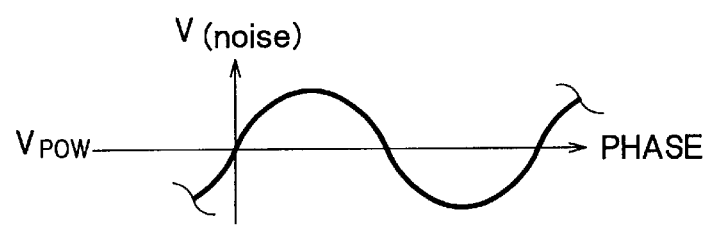
FIGS. 7A to 7E are graphs illustrating waveforms of noise.
Figure 7B:
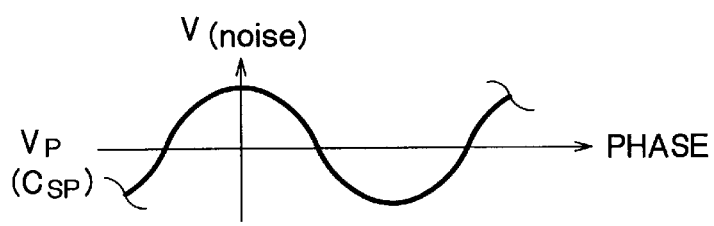
Figure 7C:
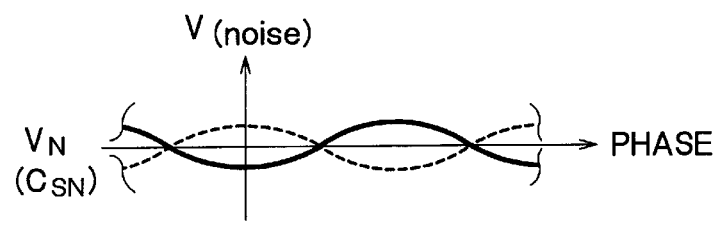
Figure 7D:
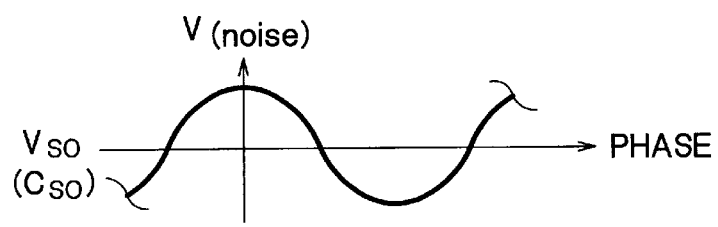
Figure 7E:
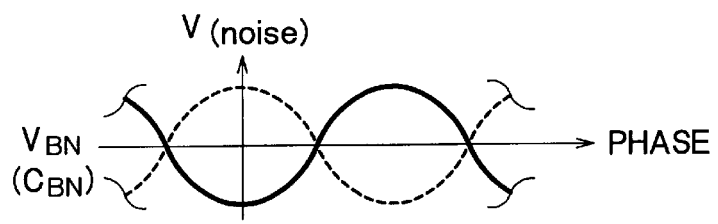

FIGS. 7A to 7E are graphs illustrating the waveforms of noise. FIG. 7A illustrates noise of the input voltage $V_{POW}$. FIG. 7B illustrates noise transmitted via the parasitic capacitance $C_{SP}$ in the output OUT. FIG. 7C illustrates noise transmitted via the parasitic capacitance $C_{SN}$ in the second input IN2 and the output OUT. In FIG. 7C, a dotted line indicates the noise in the second input IN2 and a solid line indicates the noise in the output OUT. FIG. 7D illustrates noise transmitted via the parasitic capacitance $C_{SO}$ in the output OUT. FIG. 7E illustrates noise (ballast noise) transmitted via the second capacitance element $C_{BN}$ in the output OUT. In FIG. 7E, a dotted line indicates the noise in the second input IN2 and a solid line indicates the noise in the output unit OUT. The waveforms of the noise in FIGS. 7A to 7E are depicted to facilitate the understanding conveniently and are typically different from waveforms of actual noise.

As described with reference to FIGS. 4A to 4E, the phase of the noise from the parasitic capacitance $C_{SN}$ is inverted at 180 degrees with respect to the phase of the noise from the parasitic capacitances $C_{SP}$ and $C_{SO}$. Since the noise mixed in the output voltage $V_O$ by the parasitic capacitances $C_{SP}$, $C_{SN}$, and $C_{SO}$ is a sum of a curve in FIG. 7B, a curve in FIG. 7D, and a solid curved line in FIG. 7C, the noise by the parasitic capacitance $C_{SN}$ and the noise by the parasitic capacitances $C_{SP}$ and $C_{SO}$ operate to cancel each other.

As described above, it is generally an accident and considerably rare that the absolute value of the noise from the parasitic capacitance $C_{SN}$ is the same as the absolute value of the noise from the parasitic capacitances $C_{SP}$ and $C_{SO}$ such that noise in the output voltage $V_O$ would not be generated.

Accordingly, in the second embodiment, the second capacitance element $C_{BN}$ is intentionally provided as ballast capacitance to prevent noise being mixed in the output voltage $V_O$ from the parasitic capacitances $C_{SP}$, $C_{SN}$, and $C_{SO}$. For example, when the absolute value of the noise mixed in the output voltage $V_O$ by the parasitic capacitance $C_{SN}$ is less than the absolute value of the noise mixed in the output voltage $V_O$ by the parasitic capacitances $C_{SP}$ and $C_{SO}$, as illustrated in FIG. 6, the second capacitance element $C_{BN}$ is connected between the power input $IN_{POW}$ and the second input IN2 and is provided in parallel to the parasitic capacitance $C_{SN}$. Thus, a ballast noise component indicated by the solid line in FIG. 7E is further added to the output voltage $V_O$, and thus the total sum of the noise mixed in the output voltage $V_O$ is reduced in absolute value.

For example, in the second embodiment, $NV_P$ is expressed by Expression 8:

$$NV_P = \{Z_{DC}/(Z_{DC}+1/(j\omega C_{SP}))\} \times V_{POW} \quad \text{Expression 8:}$$

Expression 9 is established based on Expressions 1 and 8:

$$NV_{OP} = (1+R_2/R_1) \times [\{Z_{DC}/(Z_{DC}+1/(j\omega C_{SP}))\} \times V_{POW}] \quad \text{Expression 9:}$$

Here, a phase of $NV_{OP}$ is advanced by 90 degrees from $V_{POW}$ by the parasitic capacitance $C_{SP}$.

When $NV_{ON}$ is a noise component mixed in the output voltage $V_O$ from the second input IN2 by the parasitic capacitance $C_{SN}$ and second capacitance element $C_{BN}$, $NV_{ON}$ is expressed by Expression 10:

$$NV_{ON} = -R_2/(1/(j\omega C_{SN}+C_{BN}))) \times V_{POW} \quad \text{Expression 10:}$$

Here, a phase of $NV_{ON}$ is delayed by 90 degrees than $V_{POW}$ (an inverted state with respect to the phase of $NV_{OP}$), as described. That is, when $V_{POW}$ is a positive voltage, $NV_{ON}$ is a negative voltage component.

$NV_{OO}$ is a noise component mixed in the output voltage $V_O$ from the amplifier circuit AMP by the parasitic capacitance $C_{SO}$, $NV_{OO}$ is the same as Expression 5 described above.

Here, a phase of $NV_{OO}$ is advanced by 90 degrees from $V_{POW}$. That is, when $V_{POW}$ is a positive voltage, $NV_{OO}$ is a positive voltage component.

A noise component $NV_O$ ($NV_{OP}+NV_{ON}+NV_{OO}$) generated in the output voltage $V_O$ by the parasitic capacitances $C_{SP}$, $C_{SN}$, and $C_{SO}$ and the second capacitance element $C_{BN}$ is expressed by Expression 11:

$$NV_O = \{(1+R_2/R_1)Z_{DC}/(Z_{DC}+1/(j\omega C_{SP}))-R_2/(1/(j\omega(C_{SN}+C_{BN})))+Z_{AMP}/(Z_{AMP}+(1/(j\omega C_{SO}))\} \times V_{POW} \quad \text{Expression 11:}$$

In order to bring the noise component $NV_O$ close to zero, the absolute value of the right side of Expression 11 may approach zero. In the second embodiment, a reciprocal (1/PSRR) of PSRR is expressed by Expression 12:

$$1/PSRR = \{(1+R_2/R_1)Z_{DC}/(Z_{DC}+1/(j\omega C_{SP}))-R_2/(1/(j\omega(C_{SN}+C_{BN})))+Z_{AMP}/(Z_{AMP}+(1/(j\omega C_{SO})))\} \quad \text{Expression 12:}$$

By bringing the absolute value of the right side of Expression close to zero, it is possible to obtain high PSRR characteristics.

In the second embodiment, the second capacitance element $C_{BN}$ is provided as ballast capacitance so that a positive component (a noise component with the same polarity as the input voltage $V_{POW}$) of Expression 12 is the same as a negative component (a noise component with a reverse polarity to the input voltage $V_{POW}$).

In the right side of Expression 12, the first and third terms related to the parasitic capacitances $C_{SP}$ and $C_{SO}$ are positive components, and the second term related to the parasitic capacitance $C_{SN}$ and the second capacitance element $C_{BN}$ is a negative component. Here, in the second embodiment, when the second capacitance element $C_{BN}$ is not provided, the reciprocal (1/PSRR) of the PSRR is assumed to be greater than 0. In this case, the negative component related to the parasitic capacitance $C_{SN}$ is less than the positive components related to the parasitic capacitances $C_{SP}$ and $C_{SO}$. Accordingly, by providing the second capacitance element $C_{BN}$ in parallel to the parasitic capacitance $C_{SN}$, it is possible to actually increase the negative component. Thus, in the linear regulator 1 according to the second embodiment, the absolute value of the reciprocal (1/PSRR) of the PSRR can be brought closer to 0 than when the second capacitance element $C_{BN}$ is not provided. Thus, in the second embodiment, it is possible to obtain the same advantages as those of the first embodiment.

The first and second embodiments may be combined.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A power circuit, comprising:
   an amplifier circuit having a first input and a second input, the amplifier circuit receiving power from a power input and outputting an output voltage corresponding to a voltage difference between the first and second inputs;
   a reference voltage circuit that supplies a reference voltage to the first input of the amplifier circuit;
   a feedback circuit that supplies a feedback voltage corresponding to the output voltage to the second input of the amplifier circuit; and
   a first ballast capacitance element electrically connected between the power input and the first input of the amplifier circuit, wherein
   the first ballast capacitance element has a capacitance value such that a reciprocal (1/PSRR) of a power supply rejection ratio (PSRR) of the amplifier circuit is closer to 0 than when the first ballast capacitance element is not provided, and the first ballast capacitance element is directly connected between the power input and the first input of the amplifier circuit.

2. The power circuit according to claim 1, wherein the feedback circuit comprises:
 a first resistance element and a second resistance element connected in series between a low supply voltage terminal and the output voltage of the amplifier circuit, and
 a node between the first and second resistance elements is connected to the second input of the amplifier circuit.

3. The power circuit according to claim 1, wherein the first ballast capacitance element comprises:
 a first electrode on a first planar device level and electrically connected to the first input of the amplifier circuit;
 a second electrode on a second planar device level and electrically connected to the power input; and
 a first insulation film between the first and second planar device levels.

4. The power circuit according to claim 1, wherein the first ballast capacitance element comprises:
 a portion of a power wiring connecting the power input to the amplifier circuit;
 a portion of a first wiring connecting the reference voltage circuit and the first input of the amplifier circuit; and
 an insulation film between the portion of the power wiring and the portion of the first wiring.

5. The power circuit according to claim 4, wherein the portion of the power wiring and the portion of the first wiring are on a same planar device level.

6. The power circuit according to claim 4, wherein the portion of the power wiring is on a first planar device level and the portion of the first wiring is on a second planar device level different from the first planar device level.

7. The power circuit according to claim 4, wherein the portion of the power wiring and the portion of the first wiring are in a serpentine pattern.

8. The power circuit according to claim 4, wherein the portion of the power wiring and the portion of the first wiring are straight line segments.

9. The power circuit according to claim 1, wherein the first ballast capacitance element comprises a wiring capacitance formed between a portion of a first wiring that connects the power input to the amplifier circuit and a portion of a second wiring connecting the reference voltage circuit to the first input of the amplifier circuit.

10. The power circuit according to claim 1, wherein the first ballast capacitance element comprises:
 a first electrode connected to the power input; and
 a second electrode connected to to the first input of the amplifier circuit.

11. The power circuit according to claim 1, further comprising:
 a second ballast capacitance element between the power input and the second input of the amplifier circuit.

12. A power circuit, comprising:
 an amplifier circuit having a first input and a second input, the amplifier circuit receiving power from a power input and outputting an output voltage corresponding to a voltage difference between the first and second inputs;
 a reference voltage circuit that supplies a reference voltage to the first input of the amplifier circuit;
 a feedback circuit that supplies a feedback voltage corresponding to the output voltage to the second input of the amplifier circuit; and
 a first ballast capacitance element electrically connected between the power input and the second input of the amplifier circuit, wherein
 the first ballast capacitance element has a capacitance value such that a reciprocal (1/PSRR) of a power supply rejection ratio (PSRR) of the amplifier circuit is closer to 0 than when the first ballast capacitance element is not provided, and
 the first capacitance element is directly connected between the power input and the second input of the amplifier circuit.

13. The power circuit according to claim 12, wherein the feedback circuit comprises:
 a first resistance element and a second resistance element connected in series between a low supply voltage terminal and the output voltage of the amplifier circuit, and
 a node between the first and second resistance elements is connected to the second input of the amplifier circuit.

14. The power circuit according to claim 12, wherein the first ballast capacitance element comprises:
 a first electrode on a first planar device level and electrically connected to the second input of the amplifier circuit;
 a second electrode on a second planar device level and electrically connected to the power input; and
 a first insulation film between the first and second planar device levels.

15. The power circuit according to claim 12, wherein the first ballast capacitance element comprises:
 a portion of a power wiring connecting the power input to the amplifier circuit;
 a portion of a first wiring connecting the node of the feedback circuit to the second input of the amplifier circuit; and
 an insulation film between the portion of the power wiring and the portion of the first wiring.

16. The power circuit according to claim 15, wherein the portion of the power wiring and the portion of the first wiring are on a same planar device level.

17. The power circuit according to claim 12, wherein the first ballast capacitance element comprises a wiring capacitance formed between a portion of a first wiring that connects the power input to the amplifier circuit and a portion of a second wiring connecting the node of the feedback circuit to the second input of the amplifier circuit.

18. The power circuit according to claim 12, further comprising:
 a second ballast capacitance element between the power input and the first input of the amplifier circuit.

* * * * *